(12) United States Patent
Qi et al.

(10) Patent No.: US 11,609,180 B2
(45) Date of Patent: Mar. 21, 2023

(54) EMITTER PACKAGE FOR A PHOTOACOUSTIC SENSOR

(71) Applicant: Infineon Technologies AG, Neubiberg (DE)

(72) Inventors: Siyuan Qi, East Grinstead (GB); Joachim Eder, Oberhaching (DE); Christoph Glacer, Munich (DE); Dominic Maier, Pleystein (DE); Mark Pavier, Felbridge (GB)

(73) Assignee: Infineon Technologies AG, Neubiberg (DE)

( * ) Notice: Subject to any disclaimer, the term of this patent is extended or adjusted under 35 U.S.C. 154(b) by 254 days.

(21) Appl. No.: 16/951,365

(22) Filed: Nov. 18, 2020

(65) Prior Publication Data
US 2021/0172862 A1 Jun. 10, 2021

(30) Foreign Application Priority Data
Dec. 10, 2019 (EP) .................................... 19215002

(51) Int. Cl.
*G01N 21/17* (2006.01)
*B81B 3/00* (2006.01)
(Continued)

(52) U.S. Cl.
CPC ....... *G01N 21/1702* (2013.01); *B81B 3/0029* (2013.01); *B81B 7/0067* (2013.01);
(Continued)

(58) Field of Classification Search
CPC ........... G01N 21/1702; G01N 21/3504; G01N 2021/1704; G01N 29/0663; B81B 3/0029;
(Continued)

(56) References Cited

U.S. PATENT DOCUMENTS 8,575,578 B1   11/2013   Shie et al.
9,360,318 B1    6/2016   Pun et al.
(Continued)

FOREIGN PATENT DOCUMENTS

EP        0859536 A1    8/1998

OTHER PUBLICATIONS ip.com, "Photoacoustic gas sensor device", IPCOM000258880D, Jun. 21, 2019, 46 pages.

*Primary Examiner* — Suman K Nath
(74) *Attorney, Agent, or Firm* — Slater Matsil, LLP

(57) ABSTRACT

The present disclosure concerns an emitter package for a photoacoustic sensor, the emitter package comprising a MEMS infrared radiation source for emitting pulsed infrared radiation in a first wavelength range. The MEMS infrared radiation source may be arranged on a substrate. The emitter package may further comprise a rigid wall structure being arranged on the substrate and laterally surrounding a periphery of the MEMS infrared radiation source. The emitter package may further comprise a lid structure being attached to the rigid wall structure, the lid structure comprising a filter structure for filtering the infrared radiation emitted from the MEMS infrared radiation source and for providing a filtered infrared radiation in a reduced second wavelength range.

14 Claims, 11 Drawing Sheets

(51) Int. Cl.
  *B81B 7/00* (2006.01)
  *B81C 1/00* (2006.01)
(52) U.S. Cl.
  CPC .. *B81C 1/00317* (2013.01); *B81B 2201/0214* (2013.01); *B81C 2203/032* (2013.01); *G01N 2021/1704* (2013.01)
(58) Field of Classification Search
  CPC ...... B81B 2201/0214; B81B 2201/047; B81B 7/0048; B81B 7/0058; B81B 7/0067; B81B 7/02; B81C 1/00317; B81C 2203/032; G01J 3/108; G01H 9/002; G08C 15/06
  See application file for complete search history.

(56) References Cited

U.S. PATENT DOCUMENTS

| | | | |
|---|---|---|---|
| 2018/0146512 A1 | 5/2018 | Pindi et al. | |
| 2018/0297834 A1* | 10/2018 | Renaud-Bezot | B81C 1/00873 |
| 2022/0236230 A1* | 7/2022 | Salzmann | G01N 29/2425 |

* cited by examiner

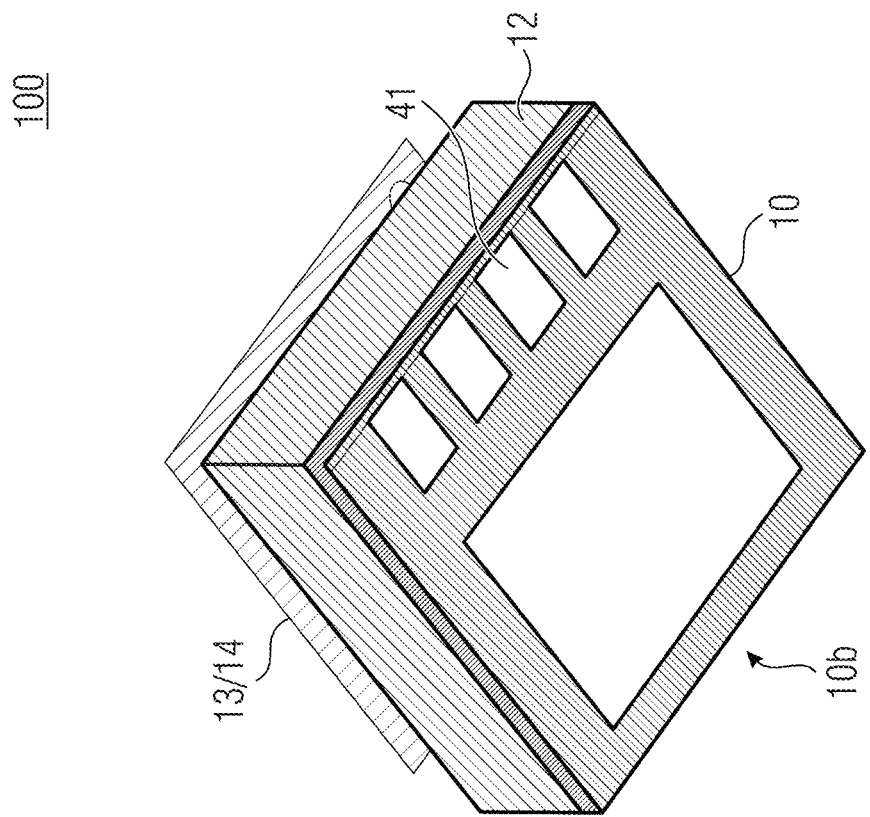
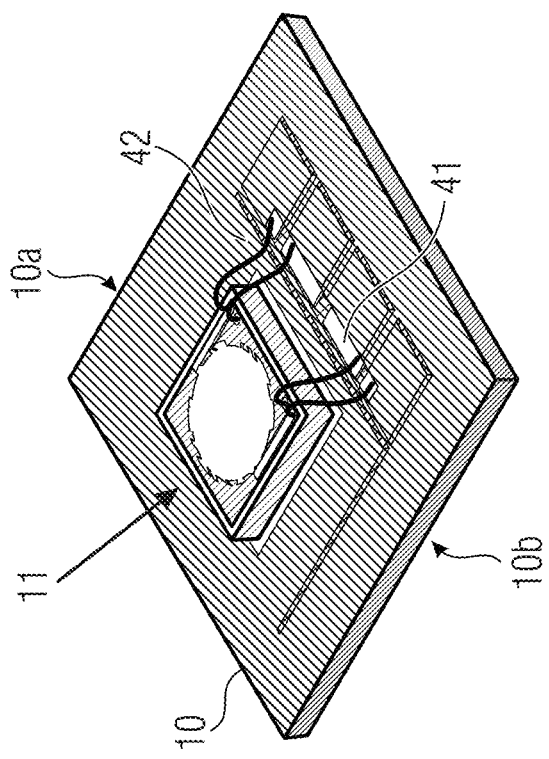
Fig. 4b
Fig. 4a

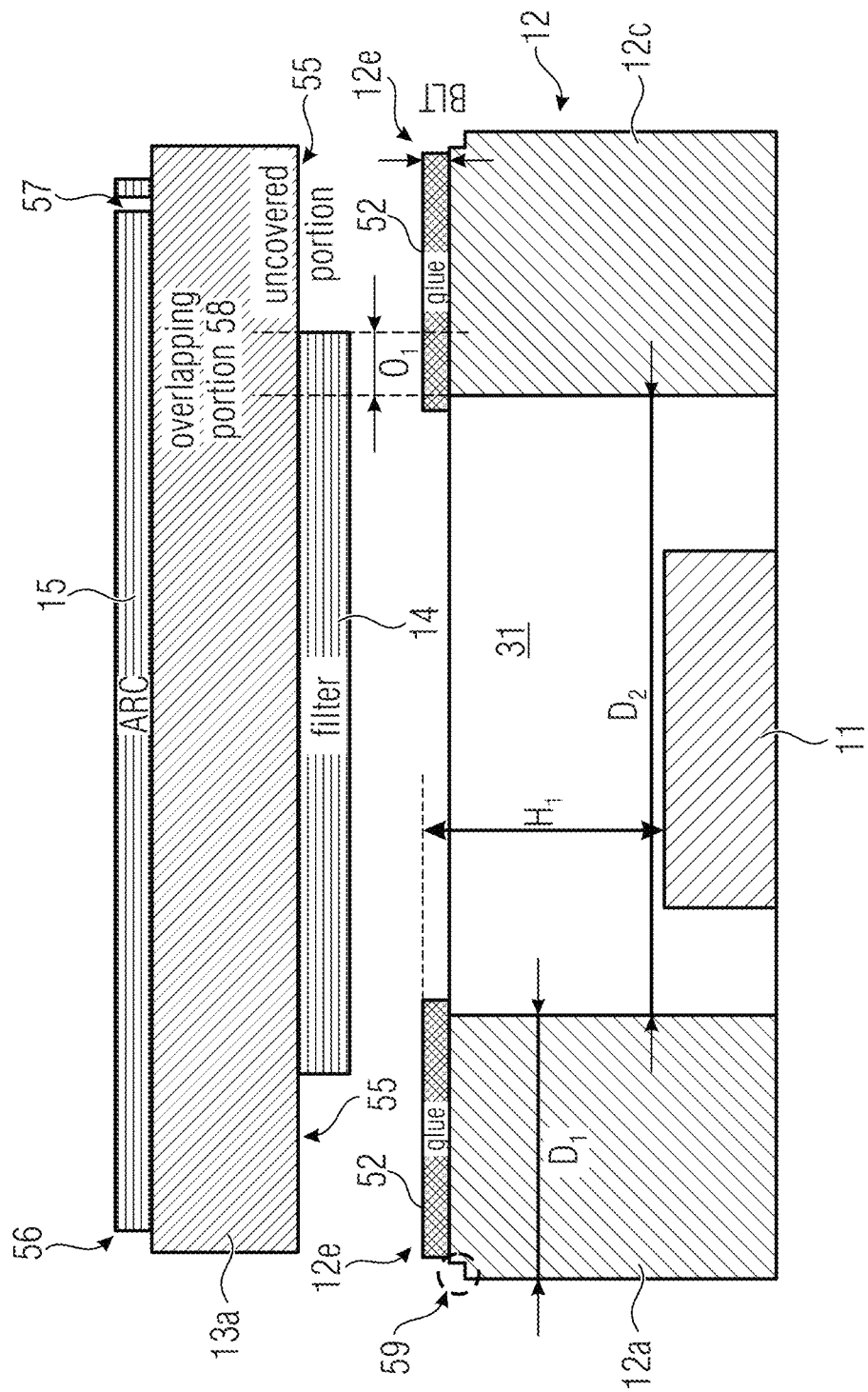

EMITTER PACKAGE FOR A PHOTOACOUSTIC SENSOR

This application claims the benefit of European Patent Application No. 19215002.7, filed on Dec. 10, 2019, which application is hereby incorporated herein by reference.

TECHNICAL FIELD

Embodiments of the present disclosure relate to a package comprising an emitter device for a photoacoustic sensor. Some particular but non-limiting examples refer to an emitter package comprising a rigid wall structure and a lid structure being attached to the wall structure. In some embodiments, the lid structure may comprise an integrated filter structure.

BACKGROUND

The photo acoustic (PA) effect is based on the transformation of pulsed radiation energy into sound. Photo acoustic spectroscopy (PAS) concepts may be used for detecting different gases based on the photoacoustic effect. Pulsed radiation (e.g., infrared: IR) may be emitted into a measurement chamber comprising a gas or a mixture of gases containing at least one analyte, i.e. at least one gas to be detected, such as $CO_2$, for example. The gas may absorb the energy of the emitted pulsed radiation which causes an alternating local heating of the gas, which leads to a thermal expansion inside the measurement chamber creating a pressure wave that may be detected as sound. Certain gases may absorb the energy at different wavelengths creating a characteristic pressure wave or sound profile.

In photo acoustic spectroscopy, hermetically sealed packages, e.g. ceramic packages and metal can packages, can be used to offer a rigid package architecture and high reliability with minimum infrared signal leakage over the lifetime of the application. Some photoacoustic sensors may comprise a MEMS membrane as an infrared heat source and a lid being transparent for the emitted radiation. Known PAS emitter packages require a deep cavity with a minimum distance of 1 mm between the MEMS membrane to the lid. The tooling costs of a ceramic package with such a deep cavity is, however, too high to fulfil the cost requirement of an entire gas sensor solution. Regarding metal can packages, these are typically high cost due to the materials and processes used in their manufacture. However, the costs of such a gas sensor solution will not be competitive if an expensive metal can, e.g. with sapphire glass window, is used.

Molded QFN packages (Quad Flat No-lead package) offer a cavity solution with a reason-able cost. However, there is a potential reliability issue due to cracking at the interface between leadframe and mold compound. Broadband unfiltered IR signal may leak through the crack. In addition, wire bonding into a pre-molded cavity requires space between the emitter die and cavity side wall in order to accommodate the wire bonding head. This space is required to prevent the head from coming into contact with the walls of the cavity during wire bonding and results in a larger package footprint. Furthermore, conventional solutions for monitoring gases, such as the odorless and colorless $CO_2$, are bulky and costly or simply not good enough for a widespread adoption.

Thus, it is desired to provide a photoacoustic sensor and an emitter package for a photoacoustic sensor, in which the emitter package is small, robust, reliable and at the same time producible at low cost.

Therefore, it is suggested to provide an emitter package for a photoacoustic sensor comprising the features of independent claim 1.

SUMMARY

According to an aspect of the present disclosure, the emitter package may comprise a MEMS infrared radiation source for emitting pulsed infrared radiation in a first wavelength range. The MEMS infrared radiation source may be arranged on a substrate. The emitter package may further comprise a rigid wall structure being arranged on the substrate. The rigid wall structure may laterally surround a periphery of the MEMS infrared radiation source. The emitter package may further comprise a lid structure being attached to the wall structure. The lid structure may comprise a filter structure for filtering the infrared radiation emitted from the MEMS infrared radiation source thereby providing a filtered infrared radiation in a reduced second wavelength range.

Some non-limiting examples, variations and embodiments are defined in the dependent claims.

BRIEF DESCRIPTION OF THE DRAWINGS

In the following, embodiments of the present disclosure are described in more detail with reference to the figures, in which:

FIG. 4A shows a schematic perspective top view of a MEMS infrared emitter mounted on a substrate;

FIG. 4B shows a perspective bottom view of an emitter package according to an embodiment;

FIG. 6 shows a schematic cross-sectional view of an emitter package according to an embodiment before the lid structure is mounted onto the rigid wall structure.

DETAILED DESCRIPTION OF ILLUSTRATIVE EMBODIMENTS

Figure 1A:
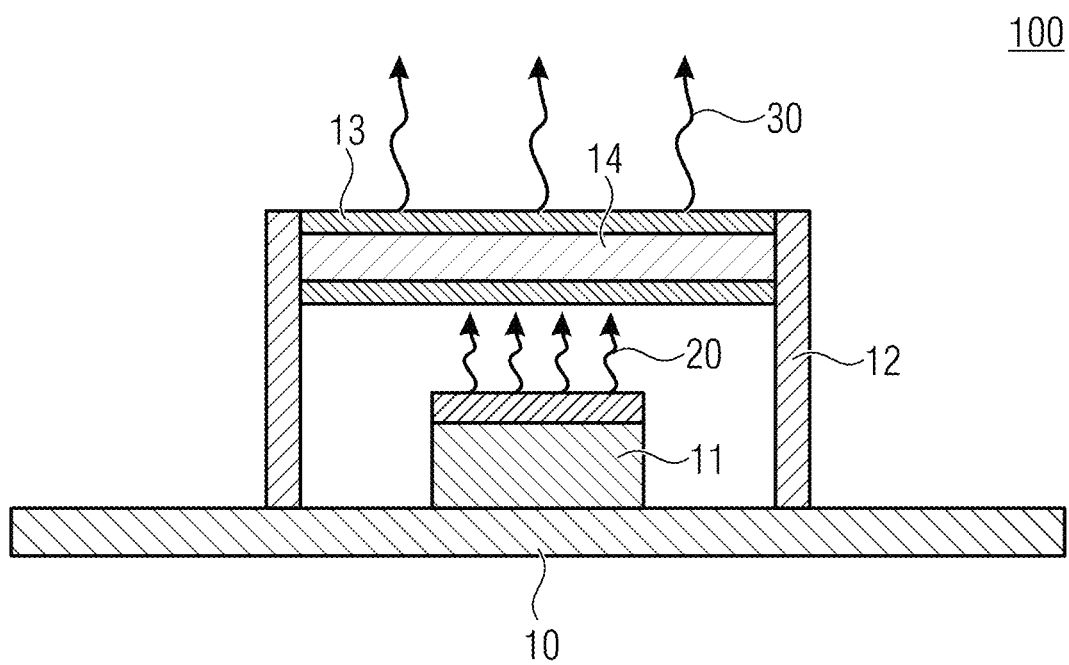
FIG. 1A shows a schematic block diagram of a side cross-sectional view of an emitter package according to an embodiment.

Equal or equivalent elements or elements with equal or equivalent functionality are denoted in the following description by equal or equivalent reference numerals.

Method steps which are depicted by means of a block diagram and which are described with reference to said block diagram may also be executed in an order different from the depicted and/or described order. Furthermore, method steps concerning a particular feature of a device may be replaceable with said feature of said device, and the other way around.

Figure 1B:
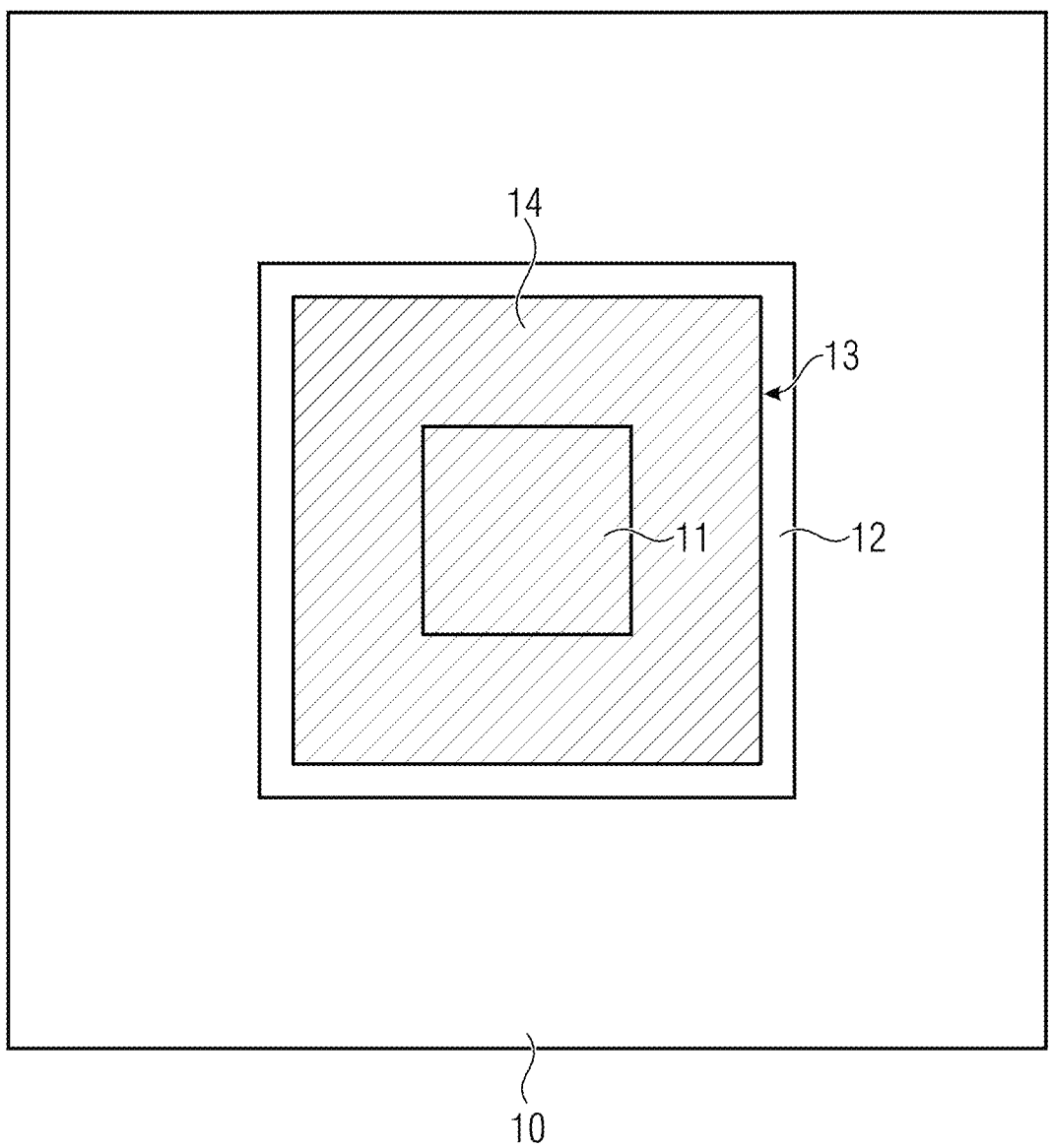
FIG. 1B shows a schematic top view of an emitter package according to an embodiment.

FIG. 1A shows a schematic side view of an emitter package 100 according to an embodiment, and FIG. 1B shows a schematic top view of the emitter package 100.

The emitter package 100 may comprise a MEMS infrared radiation source 11 for emitting pulsed infrared radiation 20 in a first wavelength range. Accordingly, the infrared radiation source 11 may also be referred to as a MEMS infrared emitter 11. The MEMS infrared emitter 11 may be configured to emit a broadband infrared signal 20.

In this disclosure, broadband infrared radiation may comprise wavelengths above 780 nm, e.g. between 780 nm and 1 mm, and preferably between 780 nm and 100 μm, or between 780 nm and 10 μm. The MEMS infrared radiation source 11 may be configured to emit infrared radiation 20 in the aforementioned wavelength ranges.

The MEMS infrared radiation source 11 may be arranged on a substrate 10. The substrate 10 may be a laminate substrate, such as a Printed Circuit Board (PCB), for example. However, other types of substrates, such as substrates comprising conducting materials, semiconducting materials or insulating materials, may be possible.

The emitter package 100 may comprise a rigid wall structure 12 being arranged on the substrate 10. The rigid wall structure 12 may be arranged around the periphery of the MEMS infrared radiation source 11, or in other words, the rigid wall structure 12 may laterally surround the MEMS infrared radiation source 11. The rigid wall structure 12 may be in direct contact with or distanced from, i.e. not contacting, the MEMS infrared radiation source 11. For example, as shown in FIG. 1A, the rigid wall structure 12 may be laterally and/or vertically distanced from the MEMS infrared radiation source 11.

Accordingly, the rigid wall structure 12 may provide at least a laterally surrounding portion of the housing or package for housing or packaging the MEMS infrared radiation source 11. The vertical distance may be 1 mm or more, which will be explained in more detail somewhat later with reference to FIGS. 6 and 7.

The rigid wall structure 12 may be non-transparent or opaque (e.g., by at least 95% or more) with respect to the emitted infrared radiation 20 emitted by the MEMS infrared radiation source 11. Accordingly, the rigid wall structure 12 may substantially shield the emitted broadband infrared radiation 20 from radiating to the outside of the package. The rigid wall structure 12 may be arranged, e.g. mounted on the substrate 10 in a gapless manner, i.e. without any substantial gaps between the rigid wall structure 12 and the substrate 10 through which the emitted broadband infrared radiation 20 could otherwise escape. Therefore, an optional sealant may be provided at the transition between the rigid wall structure 12 and the substrate 10. The sealant may, for instance, be provided through an appropriate bonding means 53, e.g. an adhesive or glue (c.f., FIG. 5G).

The emitter package 100 may further comprise a lid structure 13 being attached to the rigid wall structure 12. The lid structure 13 may comprise a filter structure 14 for filtering the broadband infrared radiation 20 emitted from the MEMS infrared radiation source 11 so as to provide a filtered infrared radiation 30 with a reduced second wavelength range.

The filter structure 14 may be embedded in the lid structure 13, as exemplarily shown in FIG. 1A. Alternatively, the filter structure 14 may be arranged on a bottom side of the lid structure 13, i.e. on a side of the lid structure 13 facing towards the MEMS infrared radiation source 11 (c.f., FIGS. 2 and 6). Further alternatively, the filter structure 14 may be arranged on a top side of the lid structure 13, i.e. on a side of the lid structure 13 facing away from the MEMS infrared radiation source 11.

As mentioned above, the MEMS infrared radiation source 11 may emit a broadband infrared radiation signal 20 in a first broadband wavelength range. The filter structure 14 may allow to transit only parts of the emitted broadband infrared radiation 20, i.e. filtered infrared radiation 30 in a reduced second wavelength range compared to the first broadband wavelength range. For instance, the filter structure 14 may only allow certain wavelengths to pass, which may be absorbed by an analyte that shall be detected. For example, if $CO_2$ shall be detected, the filter structure 14 may only allow infrared radiation 30 at a wavelength of approximately ~4.2 μm to pass, since said wavelength corresponds to an absorption peak distinct to $CO_2$ molecules. Thus, in more general terms, the filter structure 14 may only allow a predetermined portion 30 of the emitted infrared radiation 20 to pass, said predetermined portion 30 comprising a predetermined wavelength with a tolerance of ±10% (e.g., ~4.2 μm±10%), or a tolerance of 15%, or a tolerance of 20%.

Figure 2:
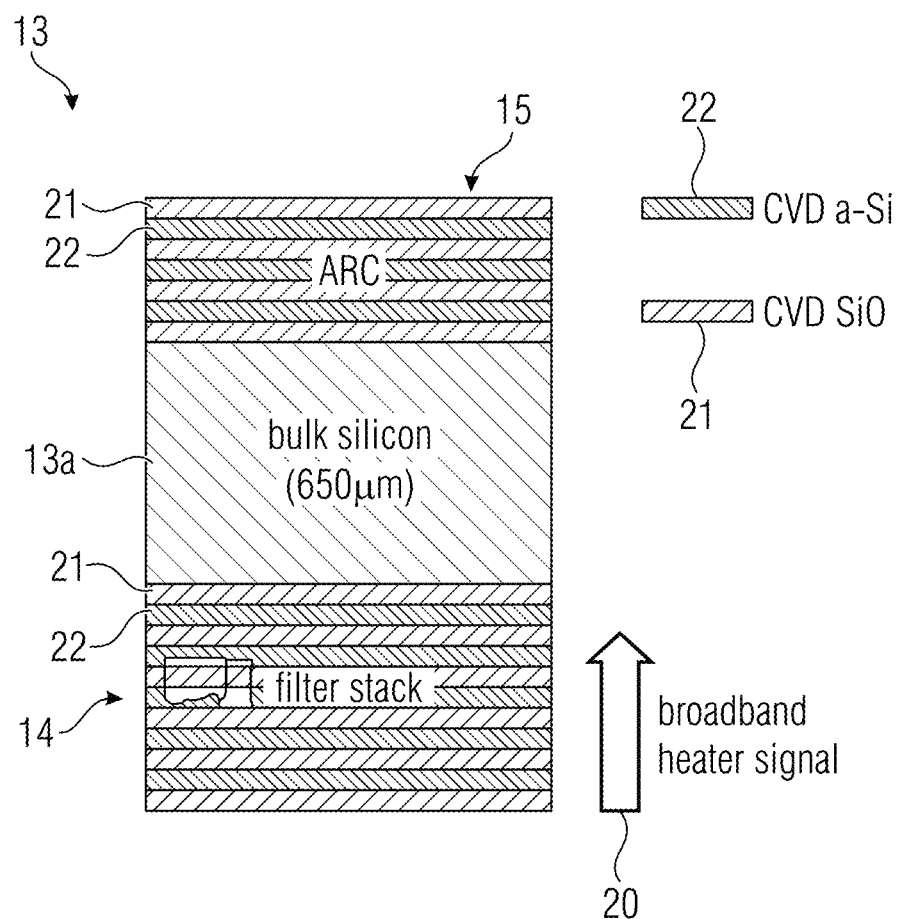
FIG. 2 shows a schematic cross-sectional side view of a section of a lid structure comprising a filter structure and an optional anti reflective coating according to an embodiment.

FIG. 2 shows a cross-sectional view of only a section of a lid structure 13 according to a non-limiting example (not drawn to scale). The lid structure 13 may comprise a lid substrate portion 13a, which may also be referred to as a die, for example bulk silicon. The lid substrate portion (die) 13a may comprise a thickness between 100 μm and 1000 μm, for example 650 μm as exemplarily depicted. The lid structure 13 may comprise a filter structure 14 that may be arranged at a first side (e.g., bottom side in FIG. 2) of the lid substrate portion 13a, e.g. at a side of the lid substrate portion 13a or the lid structure 13 facing towards the MEMS infrared radiation source 11 in an assembled state.

The filter structure 14 may comprise, or be provided as, a filter stack comprising two or more layers 21, 22 being alternatingly arranged atop each other. FIG. 2 shows, as a non-limiting example, a first layer 21 comprising silicon oxide (SiO) and a second layer 22 comprising amorphous silicon (a-Si). Of course, other suitable materials may be possible. However, such an arrangement comprising a layer stack comprising a plurality of first layers 21 and a plurality of second layers 22 being alternatingly arranged one atop the other may be suitable as a gas filter stack for transiting only infrared radiation at a wavelength being suitable for detecting a particular gas. In other words, the filter structure 14 may be configured to transit only infrared radiation comprising a wavelength that is suitable for detecting a particular target gas. In the non-limiting case of $CO_2$, e.g. the filter structure 14 may be configured to transit only infrared radiation comprising a wavelength of approximately ~42 μm±10%.

Optionally, the lid structure 13 may comprise an anti-reflective coating (ARC) 15. The anti-reflective coating 15 may be arranged at an opposite second side (e.g., top side in FIG. 2) of the lid substrate portion 13a, i.e. opposite the filter structure 14, e.g. at a side of the lid structure 13 facing away from the MEMS infrared radiation source 11. Similar to the above described filter structure 14, the anti-reflective coating 15 may comprise a layer stack comprising two or more layers 21, 22 being alternatingly arranged atop each other. FIG. 2 shows, as a non-limiting example, a first layer 21 comprising silicon oxide (SiO) and a second layer 22 comprising amorphous silicon (a-Si). Of course, other suitable materials may be possible. Accordingly, the anti-reflective coating 15 may comprise a layer stack comprising a plurality of first layers 21 and a plurality of second layers 22 being alternatingly arranged one atop the other.

The first and second layers 21, 22 in the filter stack 14 and/or in the anti-reflective coating 15 may comprise the same or different materials, depending on the desired characteristics, for example the desired wavelengths to be filtered by the filter structure 14.

Accordingly, a broadband infrared signal 20 being emitted from the MEMS infrared radiation source 11 may pass the lid structure 13, more particular the filter structure 14, the lid substrate portion 13a and the optionally available anti reflective coating 15. The filter structure 14 filters the broadband infrared signal 20 being emitted from the MEMS infrared radiation source 11 so as to produce the filtered infrared radiation 30 comprising a narrower second wavelength compared to the first broadband wavelength. The optionally available anti reflective coating 15 may increase the infrared signal throughput to about 90%.

Summarizing, the lid structure 13 (e.g., comprising silicon) may comprise a filter stack 14 (e.g., suitable for $CO_2$) on the front side of the die 13a and an ARC (anti-reflective coating) 15 on the opposite back side of the die 13a. The filter stack 14 may only allow an infrared signal with a predetermined wavelength to transit, e.g. in case of $CO_2$ a wavelength of ~4.2 µm. Generally, said predetermined wavelength may correspond to an absorption peak distinct to molecules of an analyte, e.g. a target gas to be detected, such as $CO_2$, for example.

Of course, $CO_2$ is only mentioned herein as a non-limiting example. The lid structure 13 and the filter structure 14 may be configured such that the corresponding filter response may allow to pass wavelengths which are suitable to excite/detect other analytes (e.g., gases) different from $CO_2$. These other analytes may comprise, for example, at least one of Methane, CO and volatile organic compounds (VOCs).

As mentioned above, the emitter package boo may comprise a rigid wall structure 12 that shall be explained in more detail below with reference to FIG. 3A to 3C. FIG. 3A shows an example of a rigid wall structure 12 from a perspective view, FIG. 3B shows an assembled emitter package 100 comprising said rigid wall structure 12, and FIG. 3C shows a cross-sectional side view of the assembled emitter package 100 comprising the rigid wall structure 12.

The rigid wall structure 12 may comprise four adjacent wall portions 12a, 12b, 12c, 12d forming a rectangular, and particularly square-shaped, enclosure or cavity structure comprising a cavity portion 31 at the inside. The adjacent wall portions 12a, 12b, 12c, 12d may also be referred to as vertical or upright wall portions. The wall structure 12 may comprise a different number of adjacent wall portions 12a, 12b, 12c, 12c and/or a different geometrical shape than depicted. The rigid wall structure 12 may be topless and/or bottomless, i.e. the wall portions 12a, 12b, 12c, 12d may be freestanding or self-supporting.

The rigid wall structure 12 may further comprise a bottom wall portion 12f that faces the substrate 10. Accordingly, the rigid wall structure 12 may be mounted onto the substrate 10 at its bottom wall portion 12f. The rigid wall structure 12 may further comprise a top wall portion 12e facing away from the substrate 10. The lid structure 13 may be arranged on said top wall portion 12e.

Figure 3B:
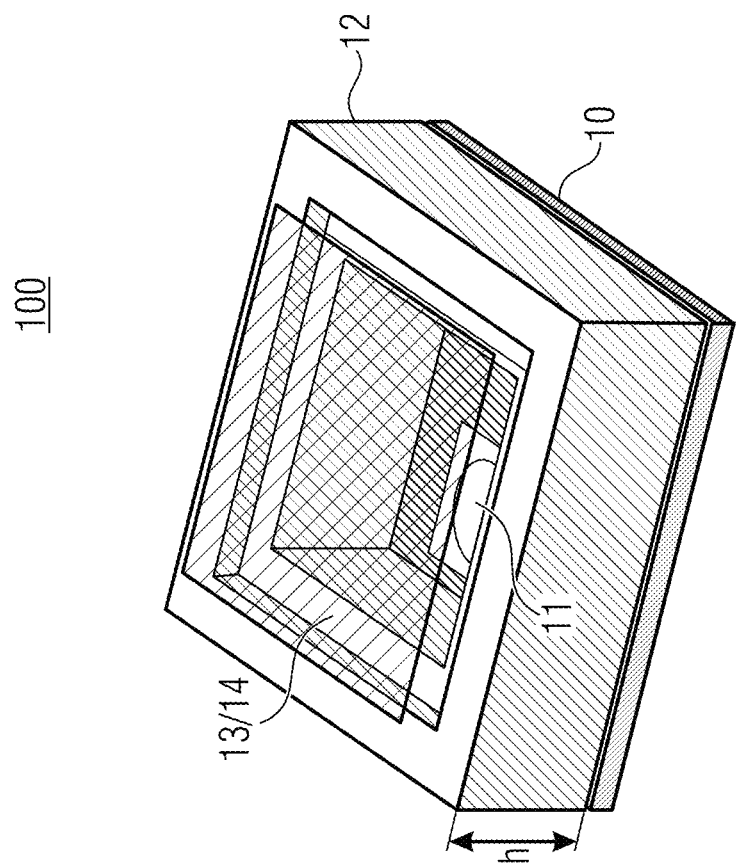
FIG. 3B shows a perspective view of an emitter package according to an embodiment.
Figure 3A:
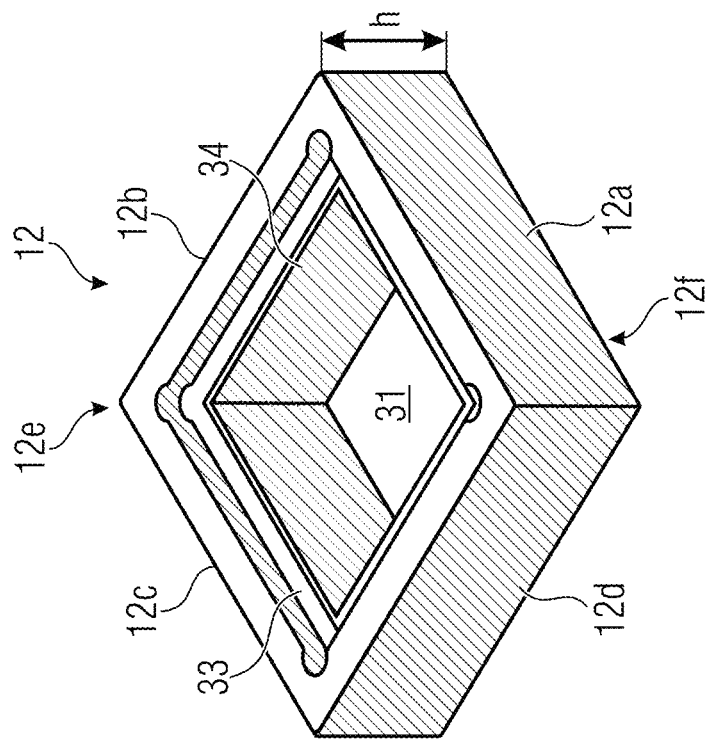
FIG. 3A shows a schematic perspective view of a rigid wall structure according to an embodiment.
Figure 3C:
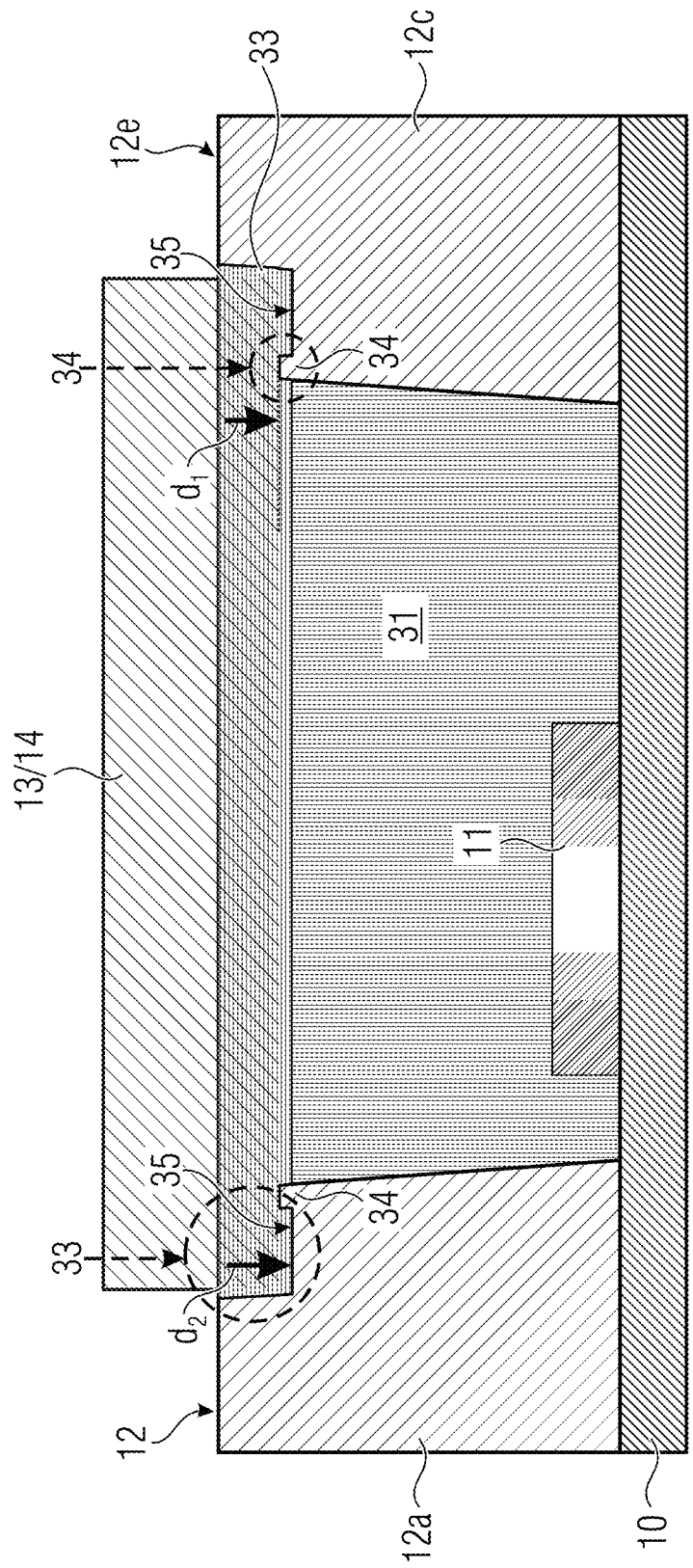
FIG. 3C shows a schematic cross-sectional view of an emitter package according to an embodiment.

As can be seen in FIG. 3B, the rigid wall structure 12 may be arranged on the substrate 10 at its bottom wall portion 12f and may laterally surround the MEMS infrared radiation source 11 that may also be arranged on the same substrate 10. In other words, the rigid wall structure 12 may be arranged around the periphery of the MEMS infrared radiation source 11. Accordingly, the MEMS infrared radiation source 11 may be placed inside the cavity 31 formed by the adjacent vertical wall portions 12a, 12b, 12c, 12d.

The rigid wall structure 12 may comprise a height h, measured vertically from the substrate 10. The height h of the rigid wall structure 12 may be larger than a height of the MEMS infrared radiation source 11. Accordingly, in an assembled state, the rigid wall structure 12 may protrude from the substrate 10 to a greater extent than the mounted MEMS infrared radiation source 11.

The lid structure 13 comprising the filter structure 14 may be mounted on a portion of the rigid wall structure 12 opposite the substrate 10, i.e. on the top wall portion 12e of the rigid wall structure 12 which faces away from the substrate 10. Accordingly, the rigid wall structure 12 and the thereon arranged lid structure 13 comprising the filter structure 14 may together provide the cavity 31 in which the MEMS infrared radiation source 11 is arranged.

Figure 4C:
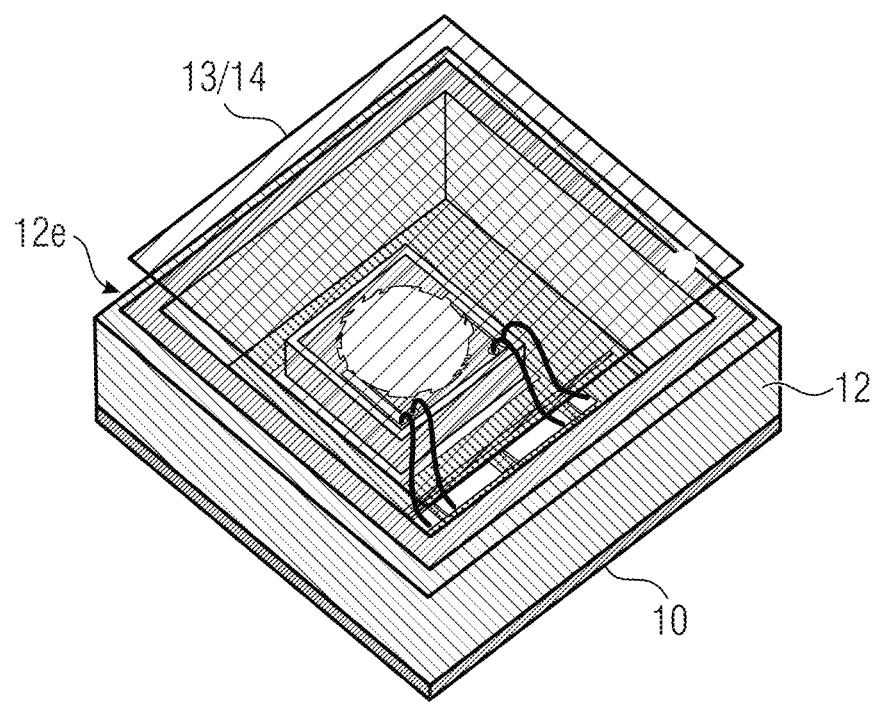
FIG. 4C shows a perspective top view of an emitter package according to an embodiment.
Figure 5B:
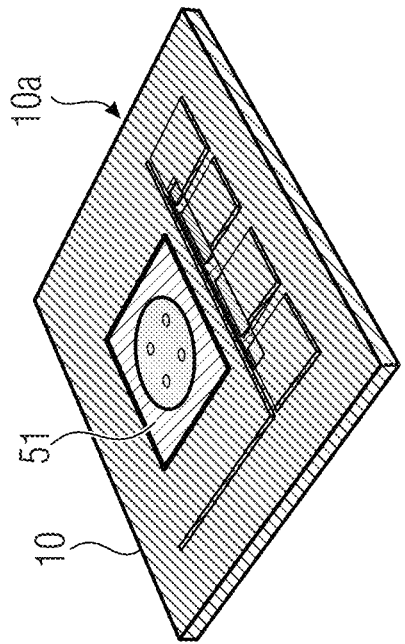
FIGS. 5A-5H show a method of assembling an emitter package according to an embodiment.
Figure 5D:
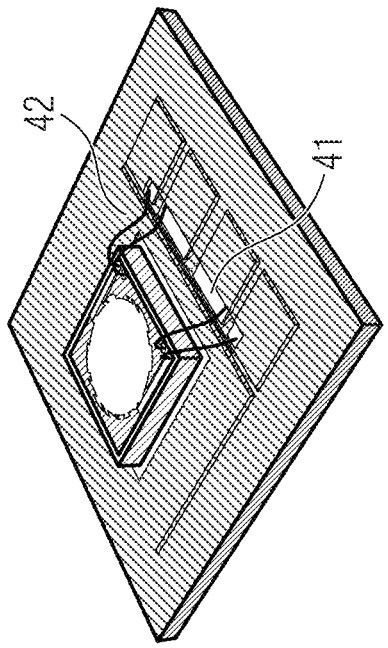
Figure 5A:
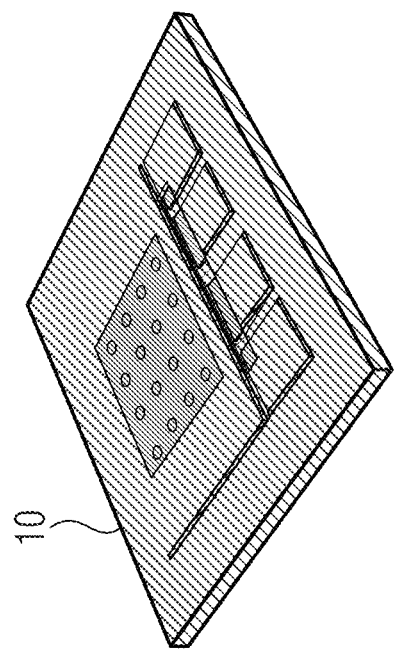
Figure 5C:
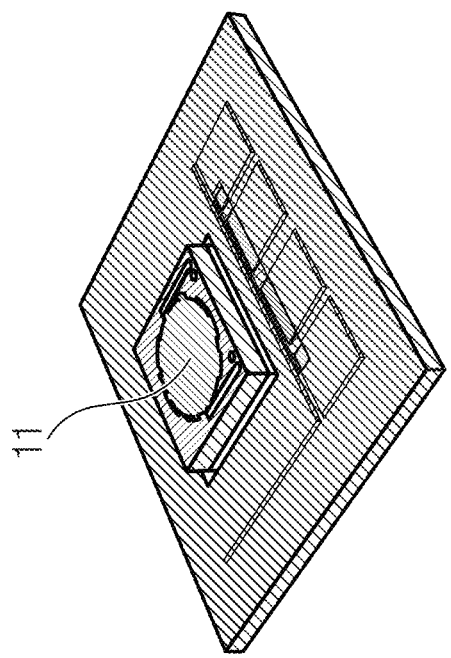
Figure 5E:
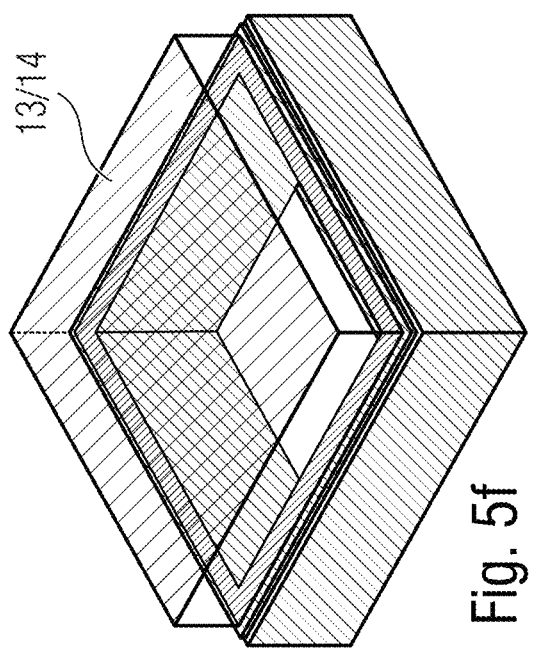
Figure 5F:
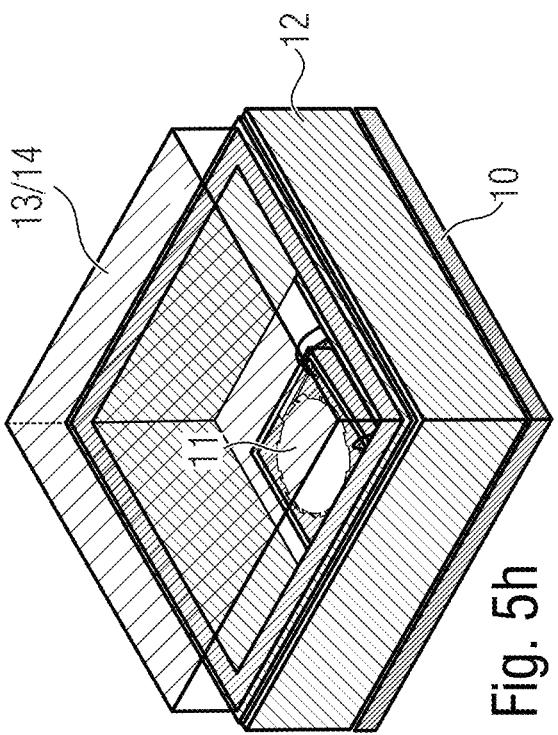

In an assembly process of the emitter package 100, the lid structure 13 comprising the filter structure 14 (e.g., with $CO_2$ filter stack) may be bonded on top of the rigid wall structure 12 directly, i.e. on the plane surfaces of the top wall portion 12e (c.f., FIGS. 4C and 5F). In order to guarantee a bond line thickness at the interface between the lid structure 13 and the rigid wall structure 12, and/or between the rigid wall structure 12 and the substrate 10, a recess structure may be provided on at least one of the top and the bottom side of the rigid wall structure 12.

In the depicted non-limiting example of FIG. 3A, the rigid wall structure 12 may comprise a recess structure 33 being provided in the top wall portion 12e facing away from the substrate 10. The recess structure 33 may be arranged at the top of each of the adjacent vertical wall portions 12a, 12b, 12c, 12d. The recess structure 33 may be provided continuously along the top wall portion 12e of the adjacent wall portions 12a, 12b, 12c, 12d. As shown in FIG. 3A by way of a non-limiting example, the recess structure 33 may be provided along the lateral inner perimeter portion of the top wall portion 12e, which lateral inner perimeter portion faces the cavity 31. As can be seen in FIG. 3B, the lid structure 13 may then be placed inside said recess structure 33. Therefore, the outer lateral dimensions of the recess structure 33 may substantially correspond to the outer lateral dimensions of the lid structure 13 such that the lid structure 13 may fit into the recess structure 33, preferably without any substantial clearance.

As mentioned above, the rigid wall structure 12 may be opaque (e.g., to at least 95%) or non-transparent for the broadband infrared radiation 20 being emitted by the MEMS infrared radiation source 11. However, as mentioned above, the lid structure 13 comprising the filter structure 14 may be at least partially transparent for the emitted infrared radiation 20 being emitted by the MEMS infrared radiation source 11. Accordingly, the rigid wall structure 12 and the lid structure 13 comprising the filter structure 14 may together provide the emitter package 100 which is laterally non-transparent for the emitted infrared radiation 20 except for the lid structure 13 being mounted on the top wall portion 12e which provides for an at least partly transmission of the emitted infrared radiation 20.

FIG. 3C shows an assembled emitter package 100 in a side sectional view. The MEMS infrared radiation source 11 is arranged inside the cavity 31 formed by the adjacent vertical wall portions 12a, 12b, 12c, 12d of the rigid wall structure 12. Accordingly, the adjacent vertical wall portions 12a, 12b, 12c, 12d may laterally surround the MEMS infrared radiation source 11 or, in other words, the adjacent vertical wall portions 12a, 12b, 12c, 12d may be arranged around the periphery of the MEMS infrared radiation source 11. The lid structure 13 comprising the filter structure 14 may be mounted on the top wall portion 12f, as explained above, e.g. at least partially inside the recess structure 33.

As can be seen in detail here, the recess structure 33 may optionally comprise a standoff feature 34. This standoff feature 34, or standoff structure, may be provided at a lateral inner perimeter portion of the recess structure 33 (i.e., an inner perimeter portion facing towards the cavity 31). For example, the standoff feature 34 may be continuously provided at the lateral inner perimeter portion of the recess structure 33. The standoff structure 34 may stand off from a bottom 35 of the recess structure 33. That is, a distance $d_1$ between the top wall portion 12e and the standoff structure 34 is smaller than a distance $d_2$ between the top wall portion 12e and a bottom portion 35 of the recess structure 33. The standoff structure 34 is particularly useful for preventing a material used to bond the lid structure 13 to the wall structure 12, e.g. an adhesive, from flowing laterally inwards towards the MEMS infrared radiation source 11 inside the cavity 31 when mounting the lid structure 13.

The additional optional recess structure 33 provided in the rigid wall structure 12 may be introduced to further improve the reliability of the emitter package 100. The recess structure 33 enables a good mechanical seal around the side of the lid structure 13 comprising the filter structure 14. The standoff feature 34 on the top wall portion 12e guarantees a desired bond line thickness of the lid/filter attach adhesive and stops the lid/filter attach adhesive from flowing into the cavity 31 towards the MEMS infrared radiation source 11.

Additionally or alternatively, a standoff feature (not explicitly shown) similar to the one explained above, may be provided on the bottom wall portion 12f of the rigid wall structure 12. Such a standoff feature may guarantee the bond line thickness when attaching or bonding the rigid wall structure 12 onto the substrate 10.

Summarizing, in embodiments the emitter package 100 shall ideally comprise a rigid wall structure 12 having a rigidity that is high enough to securely suspend the lid structure 13. Furthermore, the rigid wall structure shall ideally not be prone to cracks. Still further, the rigid wall structure 12 shall ideally be opaque or non-transparent to the emitted broadband infrared radiation 20 emitted by the MEMS infrared emitter 11. Yet further, the rigid wall structure 12 shall ideally comprise a material that allows for an easy and secure attachment of the lid structure 13 as well as an easy and secure attachment of the wall structure 12 itself on the substrate 10. In order to fulfill all these requirements, the rigid wall structure 12 may comprise, or be made from, a Liquid Crystal Polymer (LCP).

Even though other mold compounds, which have similar mechanical and optical performance compared to LCP, may be used, LCP may be preferred since this will allow (besides the advantages already mentioned above) an emitter package boo which has a considerably smaller footprint compared to conventional solutions. The footprint or the package outline dimensions of the emitter package boo may, as a non-limiting example, be 4×4×2.3 mm (with ±0.1 mm tolerance).

FIGS. 4A-4C show an example of assembling such a small emitter package 100 according to the herein described innovative principle. FIG. 4A shows the MEMS die 11 mounted onto the substrate 10. The substrate 10 may comprise a first (top) side 10a on which the MEMS infrared radiation source 11 is mounted, and an opposite second (bottom) side 10b. FIG. 4A also shows wirebonds 42 connecting electrodes on the MEMS die surface to the substrate 10, e.g. to the first side 10a of the substrate 10.

The substrate 10 may, for instance, be a laminate substrate, e.g. a PCB, having one or more electrical contacting regions 41. The MEMS infrared radiation source 11 may be connected to said electrical contacting regions 41 by means of bond wires 42, e.g. by gold wire bonds. Accordingly, this exemplary emitter package boo may comprise a MEMS heater die or MEMS infrared radiation source 11, one or more gold wire bonds 42, a laminate substrate 10, a rigid wall structure 12, preferably comprising or being made from LCP, and a combined filter lid 13, 14, e.g. comprising or being made from silicon.

FIG. 4B shows a bottom view of the emitter package 100. The substrate 10 comprises the above mentioned one or more electrical contacting regions 41 on the bottom side 10b for attaching and contacting the emitter package 100 onto a carrier substrate, e.g. a system or component board (not shown). The (LCP) wall structure 12 may be bonded on the solder mask of the laminate substrate 10 at its top side 10a.

FIG. 4C shows a top view of the emitter package 100. In this non-limiting example, the wall structure 12 may not comprise the above discussed recess structure 33. Instead, the top wall portion 12e of the rigid wall structure 12 may be substantially plane. The lid structure 13 comprising the filter structure 14 may be bonded directly onto said plane top wall portion 12e.

Accordingly, the (silicon) filter lid structure 13, 14 may be bonded on top of the (LCP) wall structure 12 to create a sealed cavity 31, as explained above. In operation, the MEMS infrared radiation source 11 may emit a broadband IR signal 30 travelling towards the (silicon) filter lid structure 13, 14, the broadband IR signal 30 comprising a first broadband wavelength. The filter lid structure 13, 14 may only transit a portion of the broadband IR signal 20 having a reduced predetermined second wavelength, e.g. in the non-limiting example of $CO_2$ a wavelength of approximately ~4.2 μm. As mentioned above, the filter structure 14 may be modified to selectively pass other wavelengths of light required to detect other gases.

FIGS. 5A-5H show the single steps of an exemplary, and non-limiting, process of manufacturing and assembling an emitter package 100 according to the herein described innovative principle.

In FIG. 5A the substrate 10, e.g. a laminate substrate such as a PCB or the like, may be provided.

In FIG. 5B a bonding means 51, e.g. an adhesive, for bonding the MEMS infrared emitter 11 onto the substrate 10 may be provided at a predetermined portion on the first (top) side 10a of the substrate.

In FIG. 5C the MEMS infrared emitter 11 may be bonded onto said predetermined portion of the substrate 10 comprising the bonding means 51.

In FIG. 5D the MEMS infrared emitter 11 may be electrically contacted with dedicated electrical contacting regions 41 by means of electrical conductors, e.g. by means of bond wires 42.

In FIG. 5E the rigid wall structure 12 may be provided. A bonding means 52, e.g. an adhesive, for bonding the lid structure 13 comprising the filter structure 14 may be provided at the top wall portion 12e of the rigid wall structure 12. In this non-limiting example, the top wall portion 12e may be plane, as described above with reference to FIG. 4A-4C. Alternatively, the top wall portion 12e may comprise the recess structure 33 (and optionally the standoff structure 34) as described above with reference to FIG.

3A-3C. In this case, the bonding means 52 would be provided inside the recess structure 33.

In FIG. 5F the lid structure 13 comprising the filter structure 14 may be bonded onto the top wall portion 12e by means of the bonding means 52.

Figure 5G:
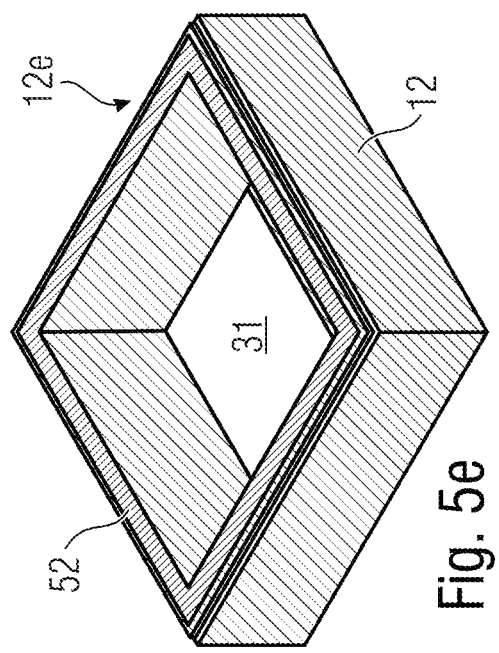

In FIG. 5G a bonding means 53 may be provided along lateral outer perimeter portions at the first (top) side 10a of the substrate 10 for bonding the rigid wall structure 12 with the substrate 10.

Figure 5H:
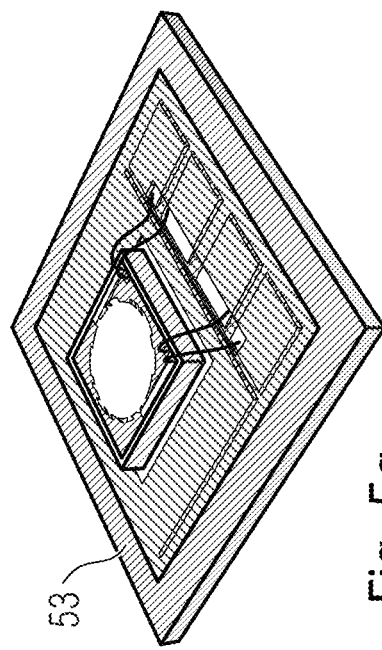

In FIG. 5H the rigid wall structure 12 having the lid/filter structure 13, 14 arranged thereon may be bonded with the substrate 10 by means of suitable bonding means 53, e.g. an adhesive or glue, being provided on the lateral outer perimeter portions of the substrate 10. In particular, the bottom wall portion 12f of the rigid wall structure 12 may be attached to the bonding means 53 arranged on the first (top) side 10a of the substrate 10.

FIG. 6 shows a further example of an emitter package 100 according to the herein described innovative principle. It shows one non-limiting example of how the lid structure 13 comprising the filter structure 14 may be bonded with the rigid wall structure 12.

As previously described above, the lid structure 13 may comprise a lid substrate 13a, e.g. a bulk silicon. Silicon may comprise a good bonding capability with LCP, in case the rigid wall structure 12 comprises, or is made from, LCP. However, additionally or alternatively, the lid substrate 13a may comprise other materials than silicon which may also have a good bonding capability with LCP.

As discussed above, the filter structure 14 may be arranged on the lid substrate 13a, e.g. on a first side (e.g., front side) facing towards the MEMS infrared emitter 11. The optional anti reflective coating ARC 15 may be arranged on the other side (e.g., back side) of the lid substrate 13a, e.g. on an opposite second side facing away from the MEMS infrared emitter 11.

In one non-limiting example of an assembly process of the emitter package 100, the front side of the lid structure 13 (e.g., with $CO_2$ filter stack 14) may be bonded directly on the plane surfaces of the top wall portion 12e of the rigid wall structure 12, as shown in FIG. 6. However, everything that is described herein with reference to the embodiment of FIG. 6 also holds true for a rigid wall structure 12 having the optional recess structure 33, as discussed above with reference to FIG. 3A to 3C.

In order to improve the adhesion between the lid structure 13 and the rigid (LCP) wall structure 12 in a cost sensitive package, a double-side etched lid structure 13 may be used. For example, the anti-reflective coating 15 may be structured, e.g. by means of etching. In this regard, the anti-reflective coating 15 may comprise a predetermined marking 57, e.g. a "Pin 1" marking, to assist pattern recognition in the package assembly and test. This avoids use of an expensive laser marking machine which is capable of marking on silicon. Accordingly, the anti-reflective coating 15 may comprise an indication for marking a predetermined pin connecting point.

Additionally or alternatively, lateral outer perimeter portions of the anti-reflective coating 15 may be etched away along the lateral outer edges of the lid substrate 13a, such that said lateral outer edges of the lid substrate 13a may remain uncovered. This may provide for a dicing street 56.

Additionally or alternatively, the filter structure 14 may be structured, e.g. by means of etching. For example, on one or more lateral outer perimeter portions of the lid substrate 13a, the filter structure 14 may be etched away such that these lateral outer perimeter portions of the lid substrate 13a remain uncovered. Accordingly, the lid substrate 13a may comprise one or more uncovered portions 55 facing the top wall portion 12e. In a non-limiting embodiment, the uncovered portion 55 may, for example, be arranged along the lateral outer edges of the lid substrate 13a, i.e. the filter structure 14 may be completely removed along the entire lateral outer perimeter of the first side of the lid substrate 13a that faces towards the MEMS infrared emitter 11.

Accordingly, in one non-limiting embodiment (not shown) the filter structure 14 may at least partially cover the first side of the lid substrate 13a leaving a lateral outer perimeter portion 55 of the lid structure 13 uncovered, wherein the lid structure 13 may be attached to the rigid wall structure 12 at least at said uncovered lateral outer perimeter portion 55.

In an alternative embodiment, such as in the non-limiting embodiment depicted in FIG. 6, the filter structure 14 may laterally overlap, at least partially, with the top wall portion 12e and the bonding means 52 arranged thereon. This is indicated in FIG. 6 as an overlapping portion 58 comprising a lateral overlap $O_1$. Said lateral overlap $O_1$ may range from 20 µm to 200 µm, or from 50 µm to 150 µm. According to a particular embodiment, the lateral overlap $O_1$ may be 100 µm±10%. In other words, the overlapping portion 58 may comprise a lateral extension $O_1$ of 100 m or less at which the filter structure 14 laterally overlaps with the rigid wall structure 12. A lateral overlap $O_1$ of 100 m or less between the lid/filter structure 13, 14 and the adhesion area 52 may allow a desired placement tolerance in the assembly process.

In other words, the lid structure 13 may comprise an overlapping portion 58 at which the filter structure 14 may laterally overlap with the rigid wall structure 12, wherein the lid structure 13 may be attached to the rigid wall structure 12 with at least one of its uncovered portion 55 and its overlapping portion 58. In some embodiments, the lid structure 13 may be attached to the rigid wall structure 12 with both its uncovered portion 55 and its overlapping portion 58.

Therefore, a bonding means 52, e.g. an adhesive or glue, may be provided at the top wall portion 12e of the rigid wall structure 12. For example, the bonding means 52 may comprise a bond line thickness BLT ranging between 10 µm and 50 µm, or between 20 µm and 40 µm. In some non-limiting examples the BLT may be approximately 30 µm±10%. The lid structure 13 may then be attached to the rigid wall structure 12 by means of said bonding means 52. Preferably, the above mentioned uncovered portions 55 of the lid substrate 13a may be brought into contact with the bonding means 52.

Summarizing, the lid structure 13 may be provided as a double-side etched die, e.g. comprising or being made from silicon. For example, on the front side of the lid structure 13, which faces the MEMS infrared emitter 11, those portions of the filter structure 14 which directly face the adhesion area (i.e., the bonding means 52) may be etched away to improve the adhesion with the wall structure 12.

The advantages of this filter design are:

It improves reliability of the emitter package 100 by minimizing the risk of delamination in the filter structure 14 at the interface between the filter structure 14 and filter attach adhesive (i.e., the bonding means 52).

There is no requirement to use new laser marking equipment in the production line.

In other words, this non-limiting exemplary embodiment may provide for a reduced size of the overlapping regions 55 providing an improved filter placement accuracy.

Further with continued reference to FIG. 6, each of the adjacent vertical side wall portions 12a-12d of the rigid wall structure 12 may comprise a lateral thickness $D_1$ ranging between 0.1 mm and 1.0 mm, or between 0.25 mm and 0.75 mm. In some non-limiting examples, the lateral thickness $D_1$ may be 0.5 mm±10%.

The cavity 31 that is formed by the adjacent vertical side wall portions 12a-12d of the rigid wall structure 12 may comprise a lateral inner dimension $D_2$ ranging between 1 mm and 5 mm, or between 2 mm and 4 mm. In some non-limiting examples, the lateral inner dimension $D_2$ may be 3 mm±10%.

When the lid structure 13 is attached to the rigid wall structure 12, i.e. when the emitter package 100 is assembled, a predetermined minimum vertical distance $H_1$ between the MEMS infrared emitter 11 and the lid structure 13 or filter structure 14 can be securely provided.

As mentioned above, in a preferred embodiment the rigid wall structure 12 may comprise, or may be made from, LCP. This may be advantageous since it allows to provide a package or housing (i.e., the rigid wall structure 12) having rigid side wall portions 12a-12d. The rigidity of said side wall portions 12a-12d is sufficiently strong so as to provide a self-supporting wall structure 12 or package at which the lid structure 13 comprising the filter structure 14 may be securely attached. In some non-limiting examples, said predetermined minimum vertical distance $H_1$ is 1 mm or more.

As mentioned above, a requirement of a PAS sensor foresees a minimum distance between the infrared emitter 11 and the lid structure 13 of at least 1 mm. In conventional ceramic packages, a deep cavity of at least 1 mm has to be created by patterning and joining together individual ceramic sheets. However, the tooling cost of such a ceramic package with deep cavity is too high to fulfil the cost requirement of the entire sensor solution. As an alternative, QFN molded packages may be provided. However, such QFN packages may tend to crack at the interface between lead frame and mold compound.

The herein described innovative principle suggests a rigid wall structure 12 comprising, or being made from, a Liquid Crystal Polymer (LCP). This allows a solution to the above existing problems. In particular, the LCP wall structure 12 may provide a rigid structure that is rigid enough to suspend the lid structure 13 spaced apart from the MEMS infrared emitter 11 at a vertical distance $H_1$ of at least 1 mm. The tooling costs for the innovative LCP wall structure 12 are considerably lower compared to conventional packages. Furthermore, the LCP wall structure 12 may be easily mounted on the substrate 10, e.g. by appropriate bonding means 53, such as adhesives or glues.

Accordingly, certain embodiments may provide a photo acoustic emitter package 100 constructed using a liquid crystal polymer (LCP) wall structure 12 and sealed by a double-side etched lid structure 13. Some advantages of the herein described emitter package 100 are:

Allows LCP cavity placement after standard die attach and wire bond process. Enables smaller footprint devices by completing die bonding and wire bonding of the MEMS device before forming a cavity. This avoids having to create extra space inside the cavity to provide access for the wirebond head.

Allows use of a LCP product platform with a cavity depth of 1.25 mm with minimal extra tooling cost (compared to molded QFN solutions and ceramic package solutions).

Allows use of low cost, standard $FR_4$ laminate.

The step structure around the perimeter of the top side of the LCP sidewall prevents damage of the silicon filter by the dicing blade during package singulation process.

Accordingly, this disclosure describes an LCP (liquid crystal polymer) sidewall structure 12 in combination with a double-side etched (silicon) filter lid 13, 14. The LCP material fulfils the requirement of a rigid sidewall structure 12 that also blocks the unfiltered IR signal 30. The LCP package also has low set up/tooling costs.

Figure 7:
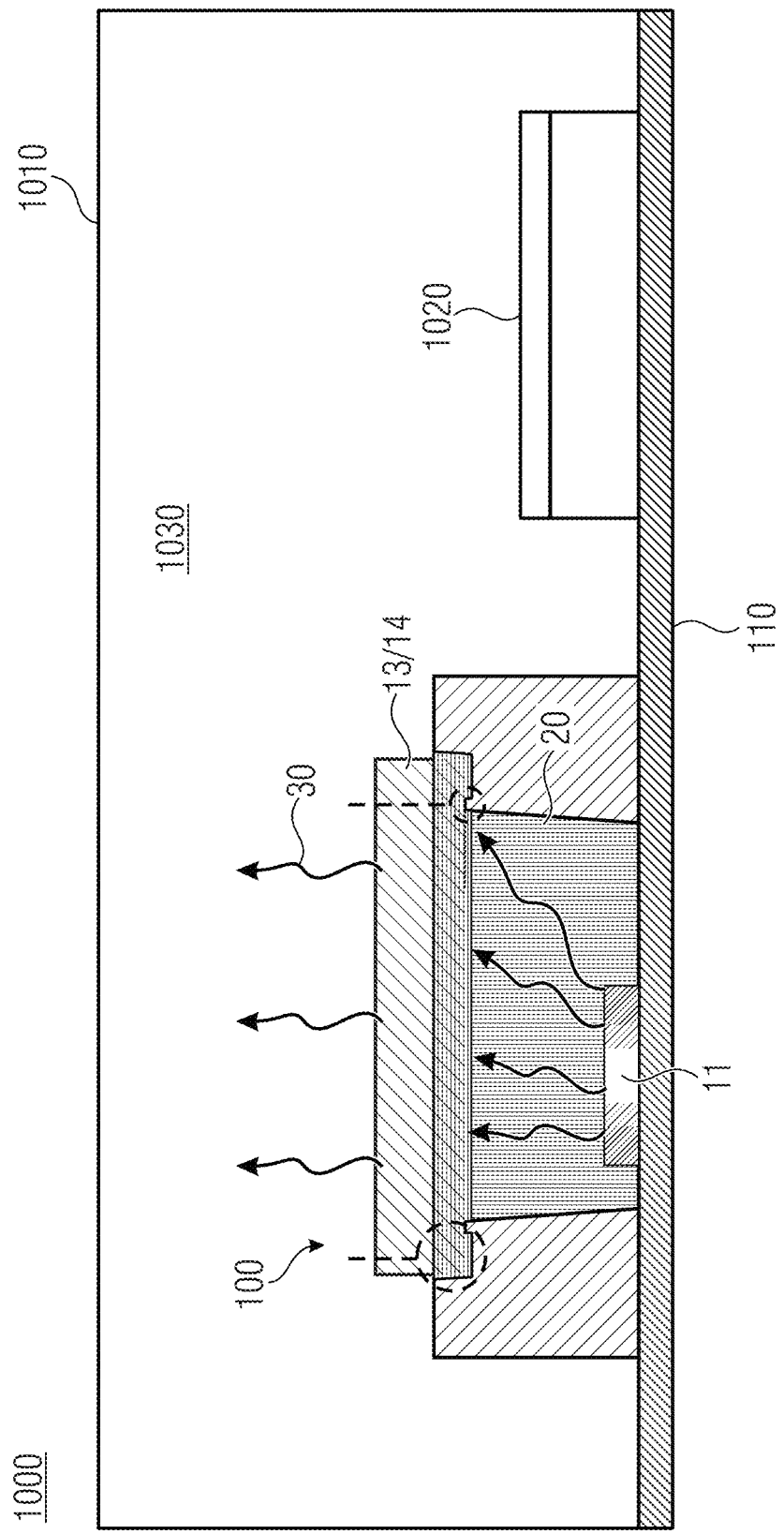
FIG. 7 shows a schematic side view of a photoacoustic sensor according to an embodiment.

FIG. 7 shows a non-limiting example of a photoacoustic sensor 1000 according to an embodiment. The photoacoustic sensor 1000 may comprise an emitter package 100 according to the innovative principle as described herein. The emitter package 100 may be arranged on a substrate 110. The photoacoustic sensor 1000 may further comprise a pressure transducer 1020, e.g. a microphone, being arranged on the same substrate no next to the emitter package 100.

The photoacoustic sensor 1000 may further comprise a housing 1010, e.g. a non-transparent metal lid being soldered onto the substrate 110. The housing 1010 may define a measurement chamber 1030. The emitter package 100 and the pressure transducer 1020 may be arranged inside said measurement chamber 1030. The emitter package 100 may emit into the measurement chamber 1030 the filtered infrared radiation 30 at the reduced second wavelength after passing the lid structure 13 comprising the filter structure 14. As a non-limiting example, if $CO_2$ shall be detected with the photoacoustic sensor 1000, then the filter structure 14 may be configured to let infrared radiation pass having a reduced second wavelength of approximately ~4.2 μm±10%.

The $CO_2$ molecules may absorb the emitted (pulsed) infrared radiation 30, which molecules begin to alternatingly heating up and cooling down thereby creating pressure or sound waves inside the measurement chamber 1030 which can be detected by the pressure transducer 1020.

Accordingly, the exemplarily depicted photoacoustic gas sensor 1000 comprises the herein described innovative emitter package 100 comprising a MEMS die 11 that emits a pulsed broadband infrared (IR) signal 20. The emitter package 100 may generate a filtered pulsed infrared signal 30 with a reduced wavelength, e.g. a wavelength of ~4.2 μm±10%, which is absorbed by particular gas molecules, e.g. by $CO_2$ gas molecules. The absorbed energy causes local heating and a pressure change in the gas sensor 1000 that can be detected by, e.g. a silicon microphone 1020. According to this non-limiting example, the signal generated by the microphone 1020 correlates with the $CO_2$ concentration in the ambient air.

In order to detect the pressure change in the photoacoustic gas sensor 1000 accurately, the emitter package 100 may comprise:

A rigid sidewall structure 12 that maintains a constant package outline dimension in operation of the gas sensor 1000 (no expansion or contraction for the emitter package 100).

No leakage of IR signal with other wavelengths apart from the predetermined reduced second wavelength region (e.g., 4.2 m for $CO_2$).

The vertical distance $H_1$ between MEMS infrared emitter 11 and the combined filter lid structure 13, 14 is >1 mm (deep cavity).

Small package footprint to save space in customer end products.

Low package cost to enable a cost effective gas sensor solution.

Accordingly, using an emitter package 100 with an LCP sidewall structure 12, as described above, enables a new cost-sensitive, optical package 100 concept for gas sensors 1000. The double-sided etched (silicon) filter lid structure 13, 14 improves the package reliability with minimum disturbance in the assembly operation. Use of the LCP sidewall structure 12 may also enable a smaller footprint compared to a conventional molded cavity solution. The use of the MEMS infrared emitter 11 within the emitter package 100 may enable a fast responding infrared light source.

This fast responding infra-red light source may be used for different sensor applications. The herein described emitter package 100 may enable a considerable miniaturization gas sensors 1000, such as $CO_2$ sensors, for example. The herein described photoacoustic sensor 1000 is ideal for smart home applications and building automation as well as indoor air quality IoT devices.

The gas sensor 1000 as described herein saves more than 75% of space in customer end products compared to commercially available gas sensors. The disclosure also enables unprecedented low manufacturing costs compared to solutions containing LEDs and lasers, which are commonly used as mid-infrared light sources for photoacoustic systems. The gas sensor 1000 as described herein may not only enable high volume and cost sensitive $CO_2$ gas sensing applications, but it may also allow for sensing other gases and volatile organic compounds.

Furthermore, a method for manufacturing an emitter package 100 for a photoacoustic sensor 1000 is suggested, the method comprising:

providing a MEMS infrared radiation source 11 for emitting pulsed infrared radiation 20 in a first wavelength range, and arranging the MEMS infrared radiation source 11 on a substrate 10, arranging a rigid wall structure 12 on the substrate 10 such that it laterally surrounds the periphery of the MEMS infrared radiation source 11, providing a lid structure 13 comprising a filter structure 14 for filtering the infrared radiation 20 emitted from the MEMS infrared radiation source 11 and to provide a filtered infrared radiation 30 in a reduced second wavelength range, and attaching the lid structure 13 to the rigid wall structure 12.

According to a further embodiment, the step of arranging the MEMS infrared radiation source 11 on the substrate 10 may be executed prior to the step of arranging the wall structure 12 on the substrate 10. As mentioned above, the rigid wall structure 12 may laterally surround the MEMS infrared radiation source 11. Accordingly, the rigid wall structure 12 may form a cavity 31 inside of which the MEMS infrared radiation source 11 resides. Providing such a cavity 31 enables a smaller solution since no additional space inside the cavity 31 is required to accommodate the bond head.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While this disclosure has been described with reference to illustrative embodiments, this description is not intended to be construed in a limiting sense. Various modifications and combinations of the illustrative embodiments, as well as other embodiments of this disclosure, will be apparent to persons skilled in the art upon reference to the description. It is therefore intended that the appended claims encompass any such modifications or embodiments.

What is claimed is:

1. An emitter package for a photoacoustic sensor, the emitter package comprising:

a MEMS infrared radiation source for emitting pulsed infrared radiation in a first wavelength range, the MEMS infrared radiation source being arranged on a substrate;

a rigid wall structure being arranged on the substrate and laterally surrounding a periphery of the MEMS infrared radiation source; and a lid structure being attached to the rigid wall structure, the lid structure comprising a filter structure for filtering the infrared radiation emitted from the MEMS infrared radiation source and for providing a filtered infrared radiation in a reduced second wavelength range, wherein the lid structure comprises a lid substrate, wherein the filter structure is provided on a first side of the lid substrate facing towards the MEMS infrared radiation source, and wherein an anti-reflective coating is provided on an opposite second side of the lid substrate facing away from the MEMS infrared radiation source, wherein the filter structure comprises a plurality of layers being deposited on a first side of the lid substrate, and wherein the anti-reflective coating comprises a plurality of layers being deposited on a second side of the lid substrate.

2. The emitter package of claim 1, wherein the rigid wall structure comprises or is made from a liquid crystal polymer (LCP).

3. The emitter package of claim 1, wherein the lid structure is mounted on a portion of the rigid wall structure opposite the substrate such that the lid structure and the rigid wall structure together form a cavity in which the MEMS infrared radiation source is arranged.

4. The emitter package of claim 1, wherein the rigid wall structure is non-transparent for the infrared radiation being emitted from the MEMS infrared radiation source.

5. The emitter package of claim 1, wherein the rigid wall structure comprises a recess structure being provided on a top wall portion facing away from the substrate, and wherein the lid structure is mounted inside said recess structure.

6. The emitter package of claim 5, wherein the recess structure comprises a standoff structure for preventing a lid attach adhesive from flowing laterally inwards towards the MEMS infrared radiation source, wherein a distance between the top wall portion and the standoff structure is smaller than a distance between the top wall portion and a bottom portion of the recess structure.

7. The emitter package of claim 1, wherein the lid substrate comprises silicon.

8. The emitter package of claim 1, wherein the filter structure partially covers the first side of the lid substrate leaving a lateral outer perimeter portion of the lid structure uncovered, wherein the lid structure is attached to the rigid wall structure at least at said uncovered lateral outer perimeter portion.

9. The emitter package of claim 1, wherein the lid structure comprises an overlapping portion at which the filter structure laterally overlaps with the rigid wall structure, and wherein the lid structure is attached to the rigid wall structure with at least one of its uncovered portion and at its overlapping portion.

10. The emitter package of claim 9,
wherein the overlapping portion comprises a lateral extension of 100 µm or less at which the filter structure laterally overlaps with the rigid wall structure.

11. The emitter package of claim 1,
wherein a distance between the lid structure and the MEMS infrared radiation source is at least 1 mm.

12. The emitter package of claim 1,
wherein the second wavelength range corresponds to an absorption spectrum of a target medium to be photoacoustically detected.

13. A photoacoustic sensor comprising an emitter package according to claim 1.

14. An emitter package for a photoacoustic sensor, the emitter package comprising:
- a MEMS infrared radiation source for emitting pulsed infrared radiation in a first wavelength range, the MEMS infrared radiation source being arranged on a substrate;
- a rigid wall structure being arranged on the substrate and laterally surrounding a periphery of the MEMS infrared radiation source; and
- a lid structure being attached to the rigid wall structure, the lid structure comprising a filter structure for filtering the infrared radiation emitted from the MEMS infrared radiation source and for providing a filtered infrared radiation in a reduced second wavelength range, wherein the lid structure comprises a multi-layer anti-reflective coating, a multi-layer filter stack, and a bulk layer interposed between the multi-layer anti-reflective coating and the multi-layer filter stack.

* * * * *